(12) United States Patent
Bulzacchelli et al.

(10) Patent No.: US 8,294,525 B2
(45) Date of Patent: Oct. 23, 2012

(54) TECHNIQUE FOR LINEARIZING THE VOLTAGE-TO-FREQUENCY RESPONSE OF A VCO

(75) Inventors: John Francis Bulzacchelli, Yorktown Heights, NY (US); Zeynep Toprak Deniz, Yorktown Heights, NY (US); Daniel Joseph Friedman, Yorktown Heights, NY (US); Shahrzad Naraghi, Austin, TX (US); Alexander V Rylyakov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 12/818,790

(22) Filed: Jun. 18, 2010

(65) Prior Publication Data

US 2011/0309888 A1 Dec. 22, 2011

(51) Int. Cl.
*H03L 7/085* (2006.01)
(52) U.S. Cl. .............................. 331/57; 331/1 A; 331/34
(58) Field of Classification Search .................... 331/57, 331/1 A, 34
See application file for complete search history.

(56) References Cited

U.S. PATENT DOCUMENTS

| | | | |
|---|---|---|---|
| 5,821,821 A | 10/1998 | Ahdab et al. | |
| 6,075,419 A | 6/2000 | Sun et al. | |
| 7,071,750 B2 * | 7/2006 | Lin | 327/251 |
| 7,391,274 B2 * | 6/2008 | Hsu | 331/57 |

OTHER PUBLICATIONS

Ali Hajimiri and Thomas H. Lee, A General Theory of Phase Noise in Electrical Oscillators, IEEE Journal of Solid-State Circuits, vol. 33, No. 2, Feb. 1998, pp. 179-194.

* cited by examiner

*Primary Examiner* — Arnold Kinkead
(74) *Attorney, Agent, or Firm* — F. Chau & Associates, LLC; Anne V. Dougherty, Esq.

(57) ABSTRACT

Apparatuses and methods are provided relating to a voltage controlled oscillator (VCO) based on current starved inverting delay stages; wherein in each stage a PMOS transistor as header and an NMOS transistor as footer are used with their gate-to-source voltages always equal to analog control voltage. The analog control voltage is also used as the supply voltage of the oscillator. An exemplary apparatus includes a VCO of n stages, where n is an odd number and where each stage includes a current starved inverter where the analog control voltage is also used as the supply voltage of each delay stage.

17 Claims, 5 Drawing Sheets

TECHNIQUE FOR LINEARIZING THE VOLTAGE-TO-FREQUENCY RESPONSE OF A VCO

This invention was made with Government support under Contract No. H98230-07-C-0409 awarded by the National Security Agency. The government has certain rights to this invention.

BACKGROUND

1. Technical Field

The present invention relates generally to voltage controlled oscillator (VCO) architectures and more specifically to circuits and methods for linearizing the voltage-to-frequency response of a controlled oscillator.

2. Discussion of the Related Art

The recent growth in wireless communication has increased the demand for more available channels in mobile communication applications, which in turn, has imposed more stringent requirements on the phase noise of local oscillators. In digital applications, phase noise caused by jitter has been addressed. In digital applications, the timing accuracy of the clock signal determines the maximum clock rate at a given supply voltage and hence the maximum number of operations per unit time. Accordingly, clock jitter directly affects timing margins and hence limits system performance.

The most common used architecture for voltage controlled oscillators in complementary metal oxide semiconductor (CMOS) technology is a voltage controlled ring type oscillator. Consisting of several cascaded delay cells, and forming a closed loop that satisfies the well-known Barkhausen Criteria for sustained oscillations, the output frequency is determined by the delay of each cell, which in return is controlled by the control voltage. Delay cell architecture selection has been influenced by noise performance specifications.

It is known that in addition to a circuit's intrinsic noise, there are additional noise sources in the integrated circuit (IC) environment that affect the frequency stability of the oscillator and hence the achievable maximum operation speed. These additional noise sources include, for example, substrate and supply noise arising from switching of digital circuitry. However, short term frequency instabilities of an electrical oscillator are in large part due to inherent device noise, such as, thermal and flicker noise.

It has been shown that the corner in the phase noise spectrum is smaller than noise corner of the oscillator's components by a factor determined by the symmetry properties of the waveform. This result is particularly relevant in metal oxide semiconductor radio frequency (MOS RF) applications because it shows that the effect of inferior MOS device noise, which has been thought to preclude their use in high-performance oscillators, can be reduced by proper design.

Linearization with discrete components, use of switched banks in digitally-controlled oscillators and frequency-locked-loop usage over a VCO to decrease the phase noise and linearize the transfer function are some of the known techniques to overcome VCO non-linearity. However, related design complexity, silicon area, power consumption and possible system instability are some drawbacks associated with these techniques. LC-tank and current mode logic (CML) based VCOs are also used to increase phase noise behavior, but require larger area and more power. Moreover, cross talk between adjacent LC tanks occurs for the VCOs implemented with on-chip inductors.

BRIEF SUMMARY

In accordance with exemplary embodiments of the present invention, an architecture and implementation for linearizing the voltage to frequency characteristics of a voltage controlled oscillator is provided.

According to an exemplary embodiment of the present invention, a voltage controlled oscillator comprises a plurality of current starved inverter stages, with a dedicated PMOS header and an NMOS footer for each stage, wherein the NMOS and PMOS transistors both have a gate-to-source voltage that is equal to an input control voltage, and the input control voltage is also used as a supply voltage of the voltage controlled oscillator.

An oscillation frequency of the voltage controlled oscillator is controlled as a linear function of the input control voltage. The oscillation frequency may be controlled within 6 to 7-bit linearity, such as shown in this specific implementation within 6.4-bit linearity.

The NMOS footer and the PMOS header may be used as respective pull-down and pull-up paths, wherein an on resistance of the pull-up and pull-down paths is modulated with the input control voltage.

The on resistance of respective pull up/down paths is written as in the following equation to the first order:

$$R = \frac{\beta_1 + \beta_2}{\beta_1 \beta_2 (V_A - V_{TH})}$$

wherein $V_A$ is the input control voltage, $V_{TH}$ is a threshold voltage, and $\beta i$ is $\mu C_{ox}(W/L)$ of an ith transistor, where the ith transistor is one of the NMOS and PMOS transistors, $\mu$ is free electron mobility in a channel of the transistor, $C_{ox}$, is the gate oxide capacitance per unit area for the transistor, and W/L is the ratio of the width and length of the channel for the transistor.

Each of the plurality of current starved inverter stages may be a delay stage of the voltage controlled oscillator. The voltage controlled oscillator comprises an odd number n of the plurality of inverter stages, wherein n is at least 3.

The input control voltage may be an analog control voltage.

The voltage controlled oscillator may form part of a time-to-digital conversion (TDC) based analog-to-digital conversion (ADC) architecture, a multi-processor platform for dynamically adjusting voltage and operation frequency, or a phase-locked-loop circuit.

In accordance with an embodiment of the present invention, a method for linearizing the voltage-to-frequency response of a voltage controlled oscillator comprises assigning an NMOS as footer and a PMOS as header of a current starved inverter stage of the controlled oscillator with the same gate-to-source voltage that is controlled by an input control voltage, and also using the input control voltage as a supply voltage of the controlled oscillator.

The method may further comprise controlling an oscillation frequency of the controlled oscillator as a linear function of the input control voltage, wherein the oscillation frequency is controlled within 6 to 7-bit linearity, such as 6.4-bit linearity.

The method may further comprise modulating on resistance of pull-up and pull-down paths of the inverter stage with the input control voltage to linearize the transfer function of the controlled oscillator.

The method may further comprise using the NMOS footer and the PMOS header as respective pull-down and pull-up paths of the inverter stage, and modulating an on resistance of the pull-up and pull-down paths with the input control voltage.

The delay stage may be implemented/realized as a current starved inverter, and the input control voltage may be an analog control voltage.

BRIEF DESCRIPTION OF THE SEVERAL VIEWS OF THE DRAWINGS

The disclosure will provide details in the following description of exemplary embodiments with reference to the following figures wherein.

DETAILED DESCRIPTION

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical functions(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

In accordance with the exemplary embodiments, an architecture and implementation are provided for linearizing the voltage to frequency response of a voltage controlled oscillator (VCO), for example, a CMOS VCO. A transfer function of a VCO is linearized by the use of a voltage controlled PMOS header and an NMOS footer in each delay stage to modulate the on resistance for pull-up/down paths. This equivalent on resistance modification enables the gain of the VCO to be controlled with input voltage with very high linearity.

A standard VCO architecture is provided, which can be used as a general purpose oscillator for a variety of applications, e.g., time to digital conversion (TDC) based Analog-to-Digital Converters (ADC) targeting, but not limited to, wireline JO applications (FIG. 3), System-on-Chip (SoC) (FIG. 4), phase-locked-loops (PLLs) (FIG. 5) etc.

An embodiment of the present invention achieves a tuning range of 1-to-2.75, i.e. 8-to-22 GHz, and linearity needed for low noise oscillator performance.

Embodiments of the present invention can take the form of an entirely hardware embodiment, an entirely software embodiment or an embodiment including both hardware and software elements. According to an embodiment, the present invention is implemented in hardware but may include software elements. The software elements may include but are not limited to firmware, resident software, microcode, etc.

The circuits as described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design may be then converted into the appropriate format (e.g., Graphic Data System II (GDSII)) for the fabrication of photolithographic masks, which may include multiple copies of the chip design in question that are to be formed on a wafer. The photolithographic masks are utilized to define areas of the wafer (and/or the layers thereon) to be etched or otherwise processed. The resulting integrated circuit chips can be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case the chip may be then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
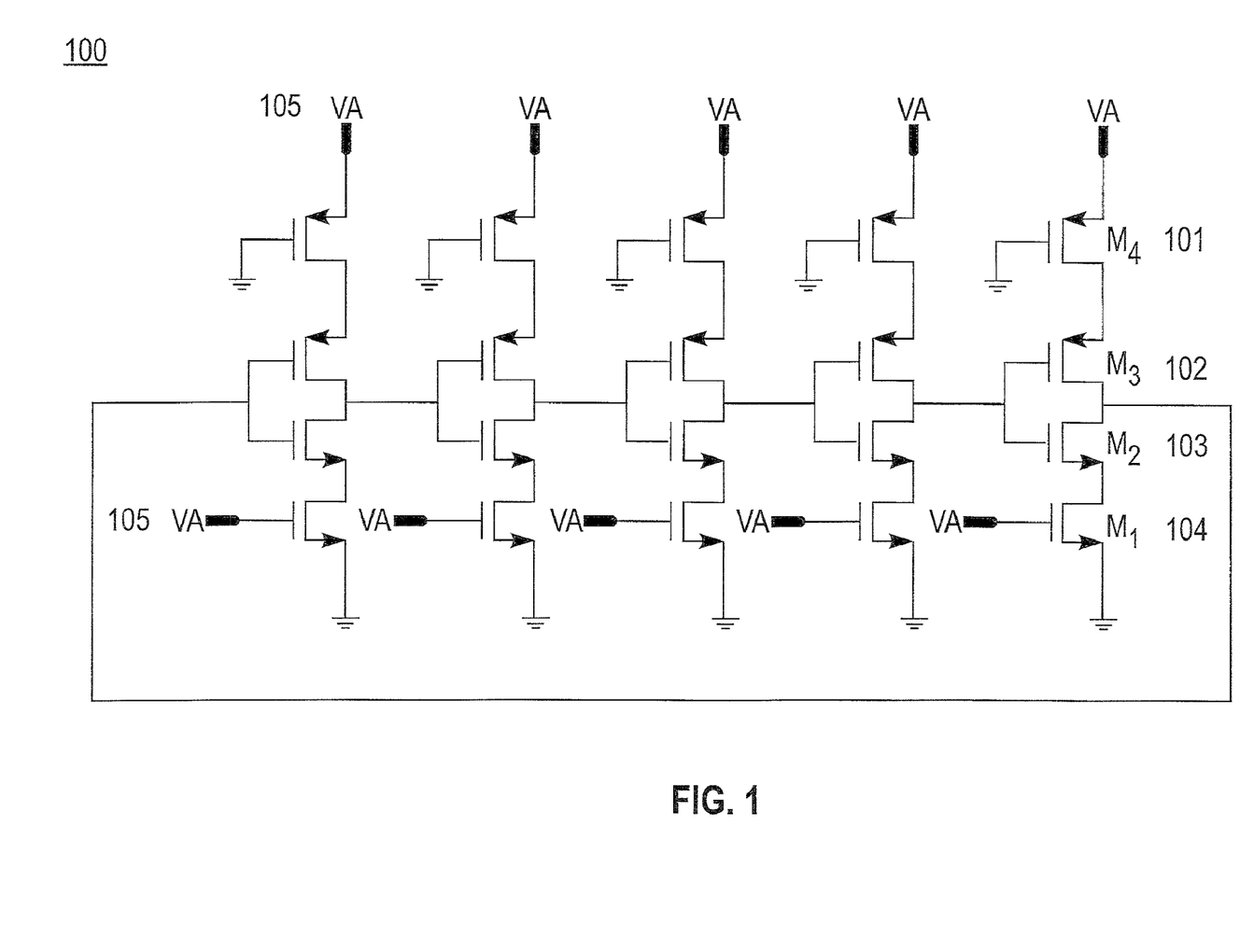
FIG. 1 is a diagram for an exemplary voltage-controlled oscillator (VCO) based on current starved inverter stages, in accordance with an embodiment of the present invention.
Figure 2:
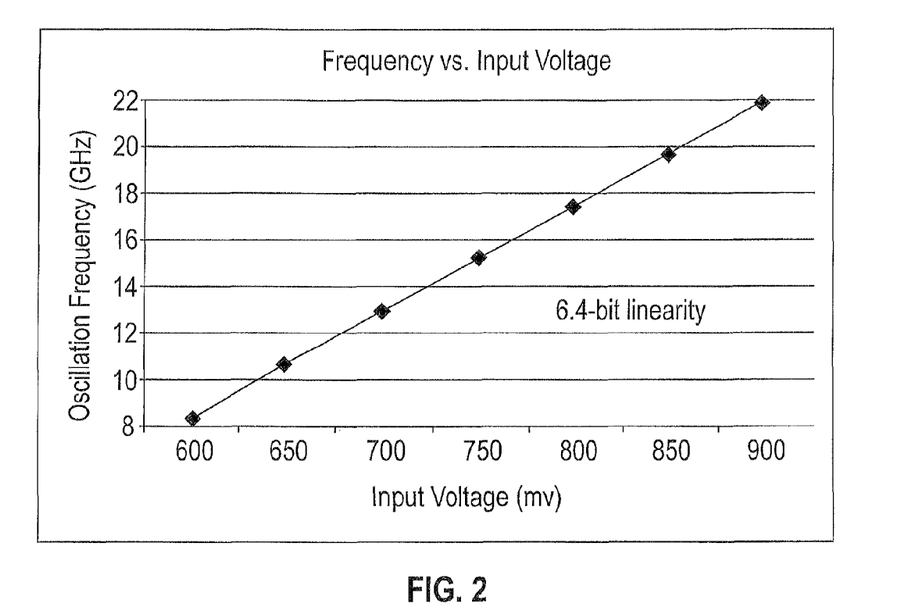
FIG. 2 is linearity relationship between input voltage and output frequency of an exemplary implementation of the VCO, in accordance with an embodiment of the present invention.

Referring now to the drawings in which like numerals may represent the same or similar elements and initially FIG. 1, an exemplary implementation of VCO architecture 100 is shown. The exemplary implementation is a five stage ring oscillator composed of current starved inverters 101, 102, 103, 104 with a dedicated NMOS transistor as the footer 104 and a dedicated PMOS transistor as the header 101 for each delay stage. VA 105 is the analog control voltage. Both header and footer transistors 101 and 104 have a gate-to-source voltage ($V_{GS}$) of VA 105, i.e., the analog control voltage. The oscillation frequency is controlled by the input voltage within 6-bit linearity. For example, as shown in FIG. 2, the oscillation frequency is controlled by the input voltage within 6.4-bit linearity.

It is to be understood that the VCO architecture according to the embodiments of the present invention is not limited to five stages of single ended current starved inverters with NMOS transistors as footers and PMOS transistors as headers, but may be an n stage ring oscillator (where n=1, 3, 5 . . . any odd number). Frequency tuning range can be adjusted by changing the number of stages and the resolution of internal phases. Referring to FIG. 2, the oscillation frequency of the VCO architecture 100 of FIG. 1 is controlled by the analog voltage VA within 6.4-bit linearity improving the phase noise behavior based on very symmetric transitions in terms of rise/fall times as a function of the analog control voltage VA. Such a high linearity number is achieved by using the analog voltage VA as both as the supply voltage of the VCO and as the gate bias of the footer device. Using the analog control voltage VA as both the supply voltage of the VCO and the gate bias of the footer device allows the $V_{GS}$ of a PMOS header and an NMOS footer, and hence their current, to be directly controlled by the input signal, so that the rise/fall times are better matched. In addition, the on resistance of internal devices also follows the input control voltage, resulting in an enhanced linearity in the voltage-to-frequency curve of the oscillator.

Figure 3:
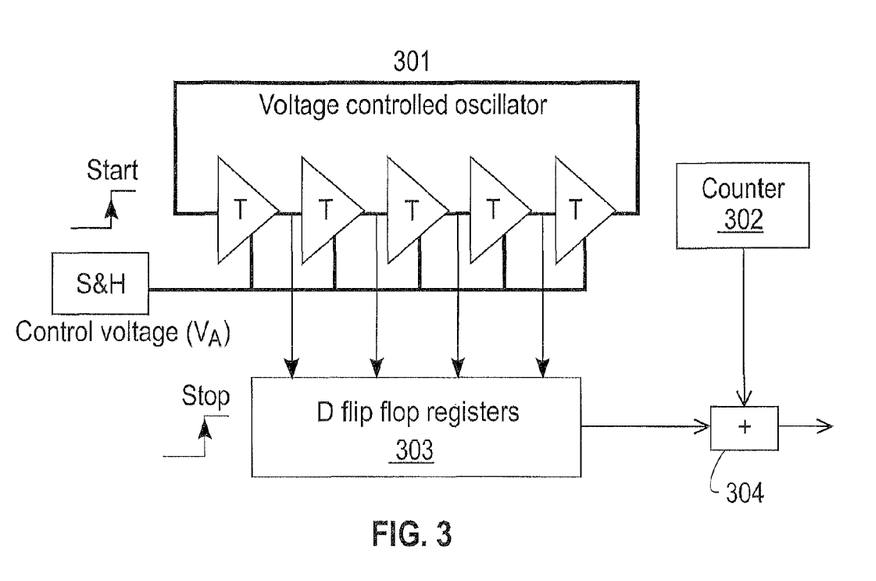
FIG. 3 is a diagram for an exemplary system incorporating the VCO of FIG. 1 and implementing analog-to-digital conversion based on time to digital conversion, in accordance with an embodiment of the present invention.

Referring to FIG. 3, the TDC based ADC architecture 300 includes a ring type VCO 301, which is the VCO of FIG. 1 having inputs for receiving the analog control voltage VA as its supply, and an output used in counter 302 to count number of pulses and detect the remainder phase within a given reference clock cycle, in this case, D flip flop registers 303, where these values are finally converted to digital representation by a digital code generator, shown as a summation block 304. As shown in FIG. 3, the VCO 301 includes five inverter stages T, as in the VCO of FIG. 1. Outputs to the D flip flop registers 303 are included after each of the inverter stages T.

In similar TDC based ADC architectures utilizing voltage-to-frequency-to-digital methods, VCO nonlinearity can be a major performance bottleneck. Hence, the availability of a compact very linear VCO in accordance with the embodiment of the present invention would enable integration of such competitive systems.

Figure 4:
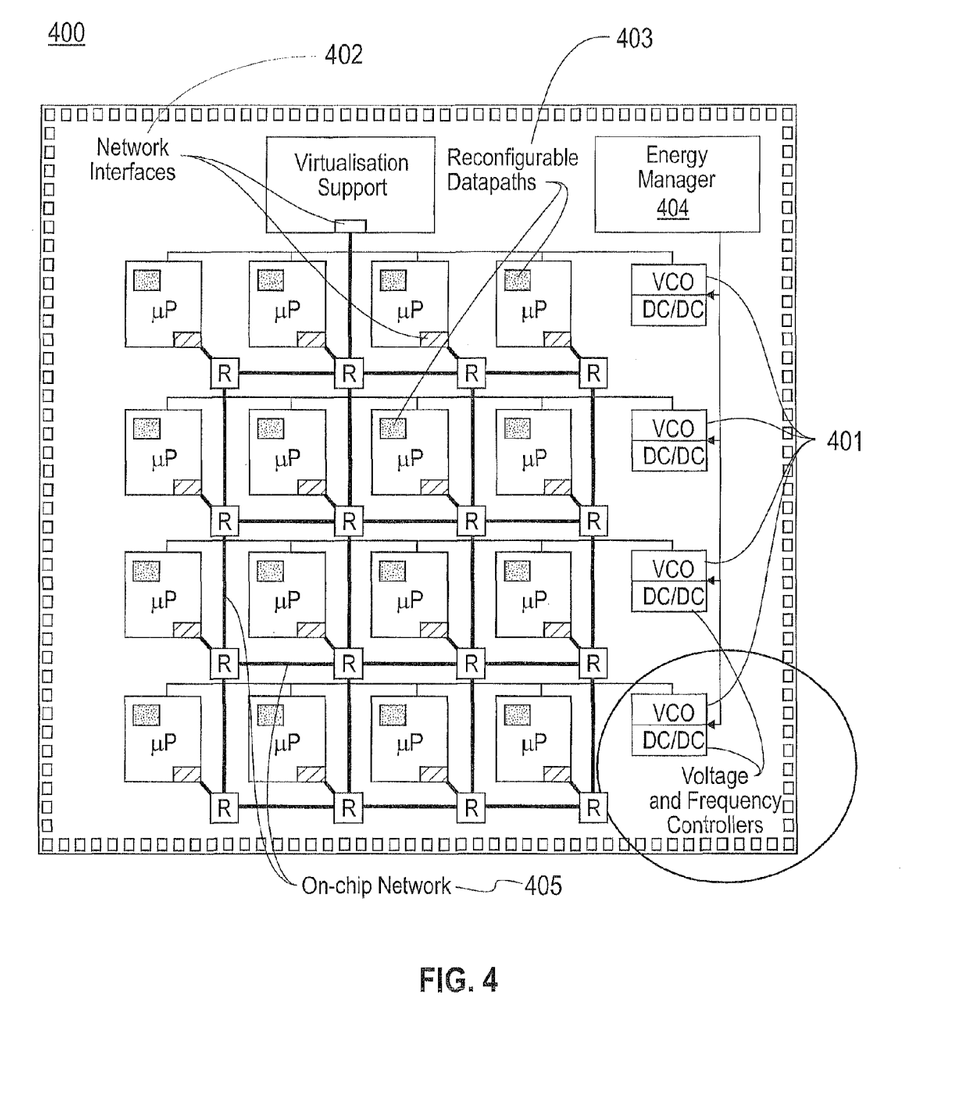
FIG. 4 is a diagram for an exemplary system incorporating more than one VCO of FIG. 1 and implementing a multi-processor platform where supply voltage and operation frequency of each processing element can be dynamically adjusted depending on workload, in accordance with an embodiment of the present invention.

Dynamic voltage scaling (DVS) is an approach for reducing energy consumption of integrated circuits whenever peak performance is not continuously required. However, achievable energy savings by discrete voltage-frequency steps alone are becoming limited as both energy and time overheads are considered between discrete state transitions. Thus, it is important to have a continuous voltage/frequency controller in a finer-grained (local) fashion because the overhead to change the processor's voltage/frequency setting has proven to be costly. Such local solutions may be valuable when considering applications where multiple units (modules) are on a single SoC (an example of which is shown in FIG. 4). Utilizing a unique supply voltage—operation frequency couple for each core subject to DVS in SoC designs has greatly increased. This approach requires a dedicated supply voltage—clock generator couple for each core in the system. To ensure the feasibility of the proposed solution, the silicon area and the power dissipation of each adaptive bias/clock generator must be kept small. The VCO according to an embodiment of the present invention, with its properties of very low power dissipation, low phase noise, wide tuning range with high linearity and very small silicon area, is a good candidate that can be used in portable, battery-operated applications. The compact and low-power VCO of an embodiment of the present invention that is constructed with no on-chip inductors would be beneficial for applications where multiple units (modules) on a single SoC are subject to DVS and require individual adjustment of their clock frequencies.

FIG. 4 illustrates a configuration for multi-core dynamic voltage-frequency adjustment. Referring to FIG. 4, an example multi-processor platform 400 includes multiple processing elements μP, network interfaces 402 to an on-chip network 405, reconfigurable data paths 403, and an energy management unit 404 controlling VCOs 401 having inputs for receiving the control voltage VA. The VCOs 401 are structured and operate in the same or similar manner to the VCO of FIG. 1 and output square waves at required frequencies of operation for target processing elements. As shown in FIG. 4, the energy management unit 404 is connected to multiple VCOs 401, which are respectively connected to groups of processing elements μP. Depending on the function of the platform, the number of processing elements μP and VCOs 401, and the number of processing elements μP connected to a VCO 401 can vary. According to the embodiment of FIG. 4, the supply voltages and the clock frequencies may be dynamically adjustable depending on instantaneous workload. Having small, low power yet highly linear VCO block would enhance the achievable energy savings in such SoC architectures.

A Phase-Locked Loop (PLL) is a closed-loop circuit that compares its output phase with the phase of an incoming reference signal and adjusts itself until both the incoming reference signal and the output phase are aligned. In other words, the PLL's output phase is "locked" to that of the input reference. Once the loop is locked, the frequency of the output signal is a multiple (integer or fractional) of the input signal's frequency. PLLs are used in frequency synthesizers such as local oscillators (LOs), and clock multipliers in microprocessors, and for such applications as recovery of clock timing information in a data stream, and demodulation of both FM and AM signals. In wireless communications ICs, PLLs are used to achieve key performance metrics of various parameters, including phase noise, spur levels, and lock time, which may trade off with each other.

Figure 5:
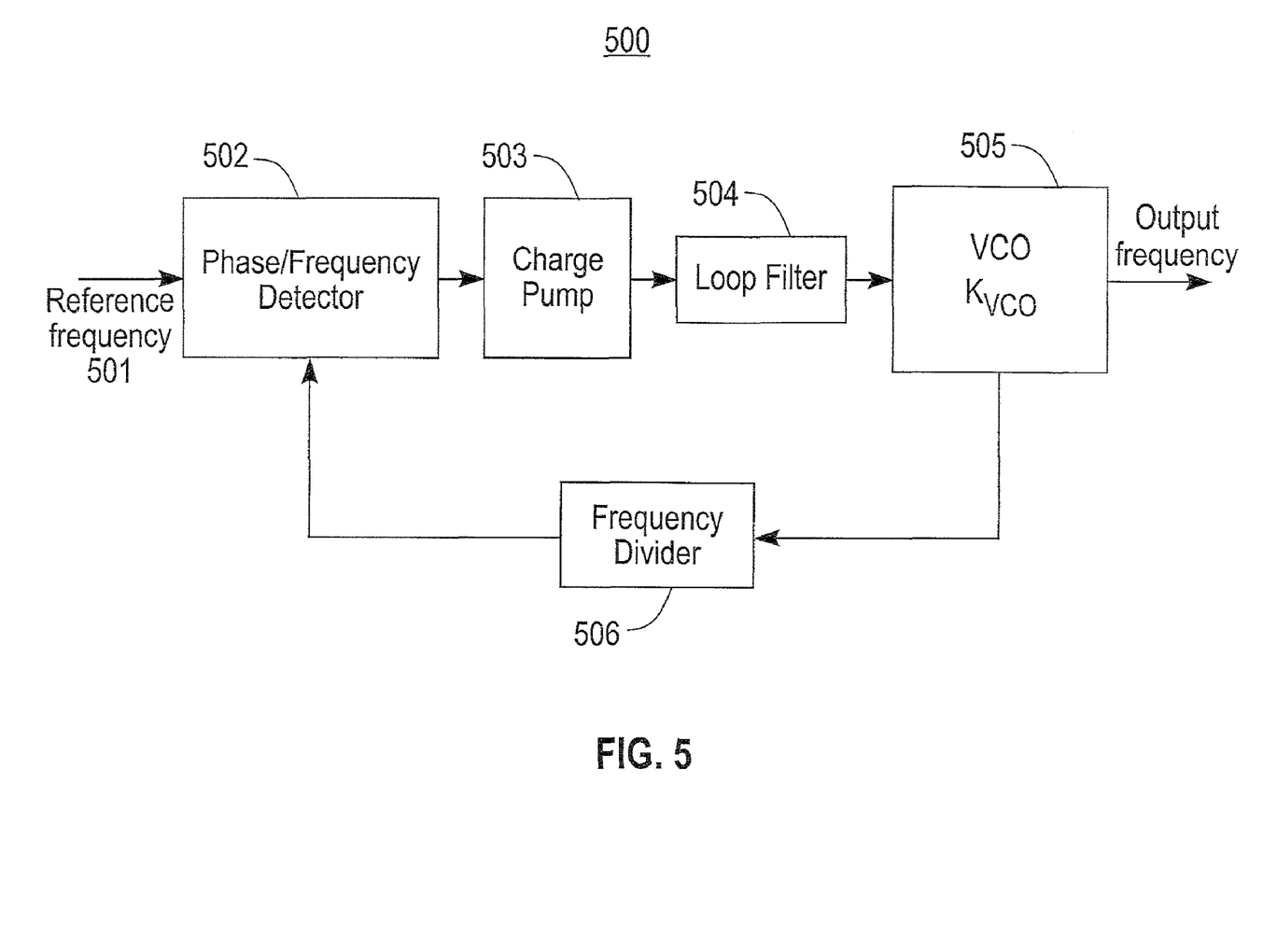
FIG. 5 is a diagram for an exemplary system incorporating the VCO of FIG. 1 and implementing a Phase-Locked-Loop, in accordance with an embodiment of the present invention.

Referring to FIG. 5, the PLL architecture 500 according to an embodiment of the present invention includes a reference frequency 501 input to a phase detector 502 whose output is connected to a charge pump 503, a loop filter 504 receiving an output from the charge pump 503 and a voltage-controlled oscillator (VCO) 505 outputting an output frequency. The frequency divider 506 divides the VCO's frequency and transmits the divided frequency back to the phase detector 502. The VCO 505 is structured and operates in the same or similar manner to the VCO in FIG. 1. Accordingly, the VCO 505 receives a control voltage that is applied to both header and footer transistors. Having a highly linear, small foot print, low power VCO without any on chip inductors in accordance with an embodiment of the present invention, would simplify the design of a PLL achieving target phase noise, spur levels and lock time, which tend to trade off with each other.

The oscillation period (T=1/f) of any ring oscillator circuit, where f is the oscillation frequency, can be expressed in terms of the summation of the propagation delays of internal gates, where the gate delay of an inverter can be approximated to first order as an RC constant.

According to an embodiment of the present invention, M1 104 and M4 101 are large transistors biased in a triode region and their resistances can be approximated to the first order by Eq. 1.

$$R_1 = 1/\beta_1(V_A - V_{TH}) \text{ and } R_2 = 1/\beta_2(V_A - V_{TH}) \quad \text{Eq. 1}$$

In Eq. 1, $V_A$ is the analog control voltage, $V_{TH}$ is the threshold voltage, and $\beta i$ is $\mu C_{ox}(W/L)$ of the ith transistor, where $\mu$ is free electron mobility in the channel, $C_{ox}$ is the gate oxide capacitance per unit area, and W/L is the ratio of the width and length of the channel for that particular transistor.

M2 103 and M3 102 will also enter the triode region as soon as the gate voltage is pulled up/down respectively for each of the transistors M2 and M3. Hence, the on resistances of the transistors M2 and M3 can also be written as in Eq. 1. The equivalent on resistance during discharge phase can then be written as in Eq. 2. Consequently the discharging current can be written as in Eq. 3, where I is discharging current, $V_A$ is analog control voltage, and R is equivalent on resistance of pull-up/down path.

$$R = R_1 + R_2 = \frac{\beta_1 + \beta_2}{\beta_1 \beta_2 (V_A - V_{TH})} \quad \text{Eq. 2}$$

$$I = V_A / R \quad \text{Eq. 3}$$

The inverter delay is the time required to charge/discharge the output capacitor (C) to the inverter threshold voltage, which can be approximated to the first order as half of the supply voltage (i.e., analog control voltage) for a properly sized inverter, and can be written as in Eq. 4.

$$I/C * \Delta t = V_A/2 \quad \text{Eq. 4}$$

In Eq. 4, I is discharging current, C is the load capacitance seen at the output node, and $\Delta t$ is time to charge/discharge C to $V_A/2$ (i.e. the threshold of the inverting delay stage).

The oscillation frequency f can be written as in Eq. 5 by solving Eq. 4 for (1/$\Delta t$).

$$f = (2C\beta_1\beta_2(V_A - V_{TH}))/(\beta_1 + \beta_2) \quad \text{Eq. 5}$$

Eq. 5 shows a linear relation between the oscillation frequency f and the controlling analog voltage $V_A$. This relation will remain linear only if the analog control voltage is also used as the supply voltage of the oscillator. In other words one can use a separate supply voltage, e.g. $V_{DD}$, and still set the $V_{GS}$ of the header and footer to be equal to $V_A$. However, in such a case the on resistance of internal devices (M2-M3) will not be controlled/changed by $V_A$ but will be constant and dependent on $V_{DD}$ (Eqs. 6a-6d), which will destroy the linearity.

$$R_1 = 1/\beta_1(V_A - V_{TH}) \text{ and } R_2 = 1/\beta_2(V_{DD} - V_{TH}) \quad \text{Eq. 6(a)}$$

$$R = R_1 + R_2 = \frac{\beta_2(V_{DD} - V_{TH}) + \beta_1(V_A - V_{TH})}{\beta_1\beta_2(V_{DD} - V_{TH})(V_A - V_{TH})} \quad \text{Eq. 6(b)}$$

During half of the oscillation period the inverter output node will be charged to the supply voltage, hence the discharging current can be written in accordance with Eq. 3 as $I=V_{DD}/R$, so that:

$$I/C * \Delta t = V_{DD}/2 \quad \text{Eq. 6(c)}$$

and $$f = \frac{2C\beta_1\beta_2(V_A - V_{TH})(V_{DD} - V_{TH})}{\beta_1(V_A - V_{TH}) + \beta_2(V_{DD} - V_{TH})} \quad \text{Eq. 6(d)}$$

Figure 6:
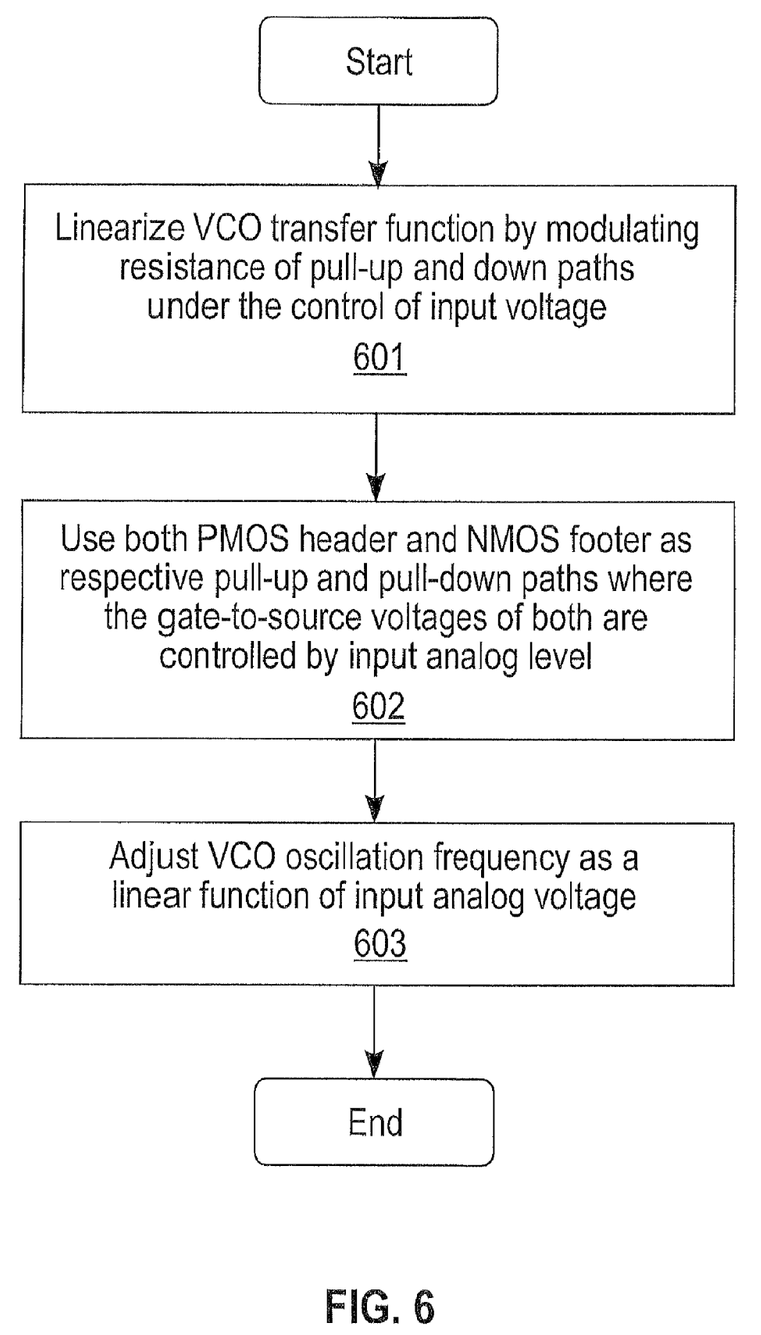
FIG. 6 is a flow diagram illustrating a method for linearizing the voltage-to-frequency response of a controlled oscillator, in accordance with an embodiment of the present invention.

Referring to FIG. 6, a flow diagram illustrates a method for linearizing the voltage-to-frequency response of a controlled oscillator, in accordance with an embodiment of the present invention. As shown in FIG. 6, the method includes linearizing a VCO transfer function by controlling the input voltage to modulate the resistance of pull-up and down paths (Step 601), using both a PMOS transistor header and an NMOS transistor footer as respective pull-up and pull-down paths, where the gate-to-source voltages ($V_{GS}$) of each are controlled by the input analog voltage level (Step 602), and adjusting the VCO oscillation frequency as a linear function of the input analog voltage (Step 603). Step 602 can be accomplished by using the analog control voltage VA as both the supply voltage of the VCO and the gate bias of the footer device, so that $V_{GS}$ of a PMOS header transistor and an NMOS footer transistor, and hence their current, are directly controlled by the input signal. An example of Step 603 is shown in FIG. 2, where the oscillation frequency is controlled by the input voltage within 6.4-bit linearity.

The proposed VCO architecture can achieve very high maximum oscillation frequency and a wide tuning range while maintaining linearity, resulting in better phase noise behavior over its tuning range of 1 to 3. Moreover, the VCO according to the exemplary embodiments has a small foot print and low power consumption, which is useful for applications where multiple units (modules), for example, on a single system-on-chip (SoC), are subject to Dynamic Voltage-Frequency Scaling (DVFS) and require individual adjustment of their clock frequencies. Accordingly, the exemplary embodiments make available a compact and low-power VCO that is constructed with no on-chip inductors. This VCO may be used in connection with robust multi-core (digital) blocks, where wide tuning range, low power and small area are regarded as the major performance parameters. Having superior linearity and phase noise, this topology can also be implemented in RF applications, for example, digital PLLs, and radar and electronic counter applications. Consequently, a standard VCO according to the embodiments of the present invention can be used as a general purpose oscillator for a variety of applications, resulting in cost benefits.

A VCO in accordance with the embodiments of the invention can have one or more of 6 to 7-bit linearity with very low power consumption, a small foot print, a reduced intrinsic noise contribution, a modular design approach, such that more unit delay cells can be cascaded, and be compatible with advance technologies since no performance critical analog block is required.

Having described exemplary embodiments of the present invention, which are intended to be illustrative and not limiting, it is noted that modifications and variations can be made by persons skilled in the art in light of the above teachings. It is therefore to be understood that changes may be made in the particular embodiments disclosed which are within the scope and spirit of the invention as outlined by the appended claims.

What is claimed is:

1. A voltage controlled oscillator, comprising:
a plurality of current starved inverter stages, wherein a dedicated NMOS transistor as footer and a dedicated PMOS transistor as header is used for each delay stage, wherein the footer and the header both have a gate-to-source voltage that is equal to an input control voltage, and the input control voltage is also used as a supply voltage of the voltage controlled oscillator, wherein the input control voltage is connected to a source of the header and to a gate of the footer for each delay stage.

2. The voltage controlled oscillator of claim 1, wherein an oscillation frequency of the voltage controlled oscillator is controlled as a linear function of the input control voltage.

3. The voltage controlled oscillator of claim 1, wherein the footer and the header are used as respective pull-down and pull-up paths, wherein an on resistance of the pull-up and pull-down paths is modulated with the input control voltage.

4. The voltage controlled oscillator of claim 3, wherein the on resistance of the pull up/down path is written as in the following equation to the first order:

$$R = \frac{\beta_1 + \beta_2}{\beta_1 \beta_2 (V_A - V_{TH})}$$

wherein $V_A$ is the input control voltage, $V_{TH}$ is a threshold voltage, and $\beta i$ is $\mu C_{ox}(W/L)$ of an ith transistor, where the ith transistor is one of the NMOS and PMOS transistors, $\mu$ is free electron mobility in a channel of the transistor, $C_{ox}$ is the gate oxide capacitance per unit area for the transistor, and W/L is the ratio of the width and length of the channel for the transistor.

5. The voltage controlled oscillator of claim 1, wherein each of the plurality of current starved inverter stages is a delay stage of the voltage controlled oscillator and comprises four transistors including the header and the footer.

6. The voltage controlled oscillator of claim 1, comprising an odd number n of the plurality of current starved inverter stages, wherein n is at least 3.

7. The voltage controlled oscillator of claim 1, wherein the input control voltage is an analog control voltage.

8. The voltage controlled oscillator of claim 1, wherein the voltage controlled oscillator forms part of a time-to-digital conversion (TDC) based analog-to-digital conversion (ADC) architecture.

9. The voltage controlled oscillator of claim 1, wherein the voltage controlled oscillator forms part of a multi-processor platform for dynamically adjusting voltage and operation frequency.

10. The voltage controlled oscillator of claim 1, wherein the voltage controlled oscillator forms part of a phase-locked-loop circuit.

11. A method for linearizing the voltage-to-frequency response of a voltage controlled oscillator, comprising:
assigning an NMOS transistor as footer and a PMOS transistor as header of a current starved inverter stage of the voltage controlled oscillator with the same gate-to-source voltage that is controlled by an input control voltage; and
using the input control voltage as a supply voltage of the voltage controlled oscillator, wherein the input control voltage is connected to a source of the header and to a gate of the footer.

12. The method of claim 11, further comprising controlling an oscillation frequency of the voltage controlled oscillator as a linear function of the input control voltage.

13. The method of claim 11, further comprising modulating a resistance of pull-up and pull-down paths of the current starved inverter stage with the input control voltage to linearize a transfer function of the voltage controlled oscillator.

14. The method of claim 11, further comprising:
using the footer and the header having the gate-to-source voltages equal to each other and also equal to the input control voltage in the respective pull-down and pull-up paths of the current starved inverter stage; and
modulating an on resistance of the pull-up and pull-down paths with the input control voltage.

15. The method of claim 14, wherein the on resistance of the pull up/down path is written as in the following equation to the first order:

$$R = \frac{\beta_1 + \beta_2}{\beta_1 \beta_2 (V_A - V_{TH})}$$

wherein $V_A$ is the input control voltage, $V_{TH}$ is a threshold voltage, and $\beta i$ is $\mu C_{ox}(W/L)$ of an ith transistor, where the ith transistor is one of the NMOS and PMOS transistors, $\mu$ is free electron mobility in a channel of the transistor, $C_{ox}$ is the gate oxide capacitance per unit area for the transistor, and W/L is the ratio of the width and length of the channel for the transistor.

16. The method of claim 11, wherein a delay stage is implemented/realized as a current starved inverter.

17. The method of claim 11, wherein the input control voltage is an analog control voltage.

* * * * *